(12) United States Patent
Biscotte et al.

(10) Patent No.: US 6,572,974 B1
(45) Date of Patent: Jun. 3, 2003

(54) MODIFICATION OF INFRARED REFLECTIVITY USING SILICON DIOXIDE THIN FILMS DERIVED FROM SILSESQUIOXANE RESINS

(75) Inventors: Mark Angelo Biscotte, Ann Arbor, MI (US); Mark Monroe Banaszak Holl, Ann Arbor, MI (US); Bradford Grant Orr, Ann Arbor, MI (US); Udo C. Pernisz, Midland, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/455,420

(22) Filed: Dec. 6, 1999

(51) Int. Cl.[7] ............................................. B32B 15/04
(52) U.S. Cl. .................. 428/450; 428/426; 428/432; 428/433; 428/446; 428/447; 428/448; 428/457; 428/469; 428/621; 428/615; 428/632; 428/641; 428/650; 428/655; 428/660; 428/668; 428/672; 428/673; 428/674; 428/680; 428/688; 428/689; 428/702; 427/160; 427/163.1; 427/164; 427/165; 427/166; 427/167; 427/168; 427/169
(58) Field of Search ................... 428/450, 469, 428/641, 650, 655, 660, 666, 668, 672, 673, 674, 680, 621, 632, 432, 433, 447, 688, 689, 702; 427/163.1, 164, 165, 166, 167, 168, 160, 169

(56) References Cited

U.S. PATENT DOCUMENTS

| 3,850,508 | A | * | 11/1974 | Sittig et al. .................. 356/209 |
| 3,877,049 | A | * | 4/1975 | Buckley ........................ 257/4 |
| 4,240,696 | A | * | 12/1980 | Tracy et al. ................. 350/163 |
| 5,075,738 | A | * | 12/1991 | Matsuda et al. ............... 257/49 |
| 5,140,398 | A | * | 8/1992 | Matsuda et al. ............... 257/53 |
| 5,170,238 | A | * | 12/1992 | Sakai et al. .................. 327/514 |
| 5,312,684 | A | | 5/1994 | Michael ....................... 428/336 |
| 5,403,748 | A | | 4/1995 | Pernisz ........................ 436/113 |
| 5,408,353 | A | * | 4/1995 | Nichols et al. .............. 359/275 |
| 5,569,565 | A | * | 10/1996 | Kawakami et al. ............ 430/1 |
| 5,693,565 | A | | 12/1997 | Camilletti .................... 437/192 |
| 5,780,163 | A | | 7/1998 | Camilletti .................... 428/446 |
| 5,866,197 | A | | 2/1999 | Bremmer ...................... 427/96 |
| 6,066,844 | A | * | 5/2000 | Ford et al. ............. 250/227.21 |
| 6,249,082 | B1 | * | 6/2001 | Fukuyoshi et al. ......... 313/479 |

* cited by examiner

Primary Examiner—Deborah Jones
Assistant Examiner—Andrew T Piziali
(74) Attorney, Agent, or Firm—Brooks & Kushman P.C.

(57) ABSTRACT

Changes in the infrared reflection spectrum of a thin film of silica-like resinous material sandwiched between metal electrodes can be induced by applying an electric potential to a top electrode which is semitransparent. Characteristic infrared absorption lines change in proportion to a small electric current flowing through the material. These changes occur with response times of the order of seconds, and show time constants of the order of minutes to reach stationary values.

20 Claims, 4 Drawing Sheets

Si-H AREA @ 2260 cm$^{-1}$ vs. CURRENT

CIRCUIT CURRENT (μA)

Si-H AREA vs. VOLTAGE$^{1/2}$

MODIFICATION OF INFRARED REFLECTIVITY USING SILICON DIOXIDE THIN FILMS DERIVED FROM SILSESQUIOXANE RESINS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

This invention is directed to silicon dioxide thin films derived from certain silsesquioxane resins, in particular, hydridosilsesquioxane resins, i.e., hydrogen silsesquioxane resins, alkyl silsesquioxane resins, or aryl silsesquioxane resins, in which the infrared reflection of a surface covered by the thin film can be varied.

BACKGROUND OF THE INVENTION

Silicon dioxide ($SiO_2$) plays a crucial role in the microelectronics industry as an insulator. Typically, the oxide is generated by direct oxidation of silicon using oxygen. A variety of plasma-based methods have also been developed to allow for lower temperature processing. These methods, however, although being capable of forming highly ordered oxides, do not generally lend themselves to the tailoring of the dielectric properties of the silicon dioxide for specific applications, and at the same time, place considerable chemical restrictions on when such oxides can be incorporated into an electrical device.

Thus, the generation of silicon oxides using certain hydridosilsesquioxane (HSQ) resins has emerged as an important alternative to such thermal and plasma-based methodologies. The use of these HSQ resins, for example, allows the properties of the derived silicon oxide to be tailored for specific applications which run the gamut from computer chips to sensors.

However, despite the apparent chemical simplicity of these systems, i.e., H, Si, and O, a detailed understanding of the structure and the reactivity of such materials, particularly under conditions experienced by an operating device, has yet to be fully realized.

In this regard, while metal-insulator-metal (MIM) devices exhibiting negative differential resistance (NDR) electrical properties are generally known, for example, as shown in U.S. Pat. No. 5,312,684 (May 17, 1994), and U.S. Pat. No. 5,403,748 (Apr. 4, 1995), the chemical basis for the striking changes in resistance which occur as a function of an applied voltage or current is not fully understood.

In probing the nature of changes in the dielectrics of such devices, it was unexpectedly discovered that an MIM device could be designed to allow for its simultaneous electrical and spectroscopic characterization, and these characteristics of the device are considered unique.

BRIEF SUMMARY OF THE INVENTION

The invention relates to varying the infrared reflection of a surface covered by a silicon dioxide thin film derived from a silsesquioxane resin. The resin can be, for example, a hydridosilsesquioxane resin, an alkyl silsesquioxane resin, or an aryl silsesquioxane resin. Hydridosilsesquioxane resins are representative, and used hereafter in referring to silsesquioxane resins in general. The concept involves:

(i) directing a beam of infrared radiation to a metal-insulator-metal device containing the silicon dioxide thin film derived from hydridosilsesquioxane resin, (ii) applying an electric potential difference across the metal-insulator-metal (MIM) device containing the silicon dioxide thin film derived from hydridosilsesquioxane resin, and (iii) monitoring variation in the infrared reflection spectrum of the MIM device in response to the electric current flowing through the silicon dioxide thin film as the frequency of incident radiation is varied.

These and other features of the invention will become apparent from a consideration of the detailed description.

BRIEF DESCRIPTION OF THE SEVERAL VIEWS OF THE DRAWING

In FIGS. 1 and 2, it can be seen that the MIM device consists of a substrate such as a glass slide upon which there is applied a gold bottom electrode, a dielectric layer consisting of a thin film derived from hydridosilsesquioxane polymer, and a thin palladium top electrode. A beam of infrared radiation, i.e., an infrared light beam, passes through the palladium and HSQ-derived thin film layers, and is reflected off the bottom gold electrode. The thin palladium metal top electrode allows transmission of the beam of infrared radiation and voltage ramping of the MIM device.

FIG. 3 shows measured infrared relative reflection spectra relative to the initial spectrum of an HSQ-derived thin film before application of an electric potential difference as a function of the current flowing through the HSQ-derived thin film.

Figure 3:
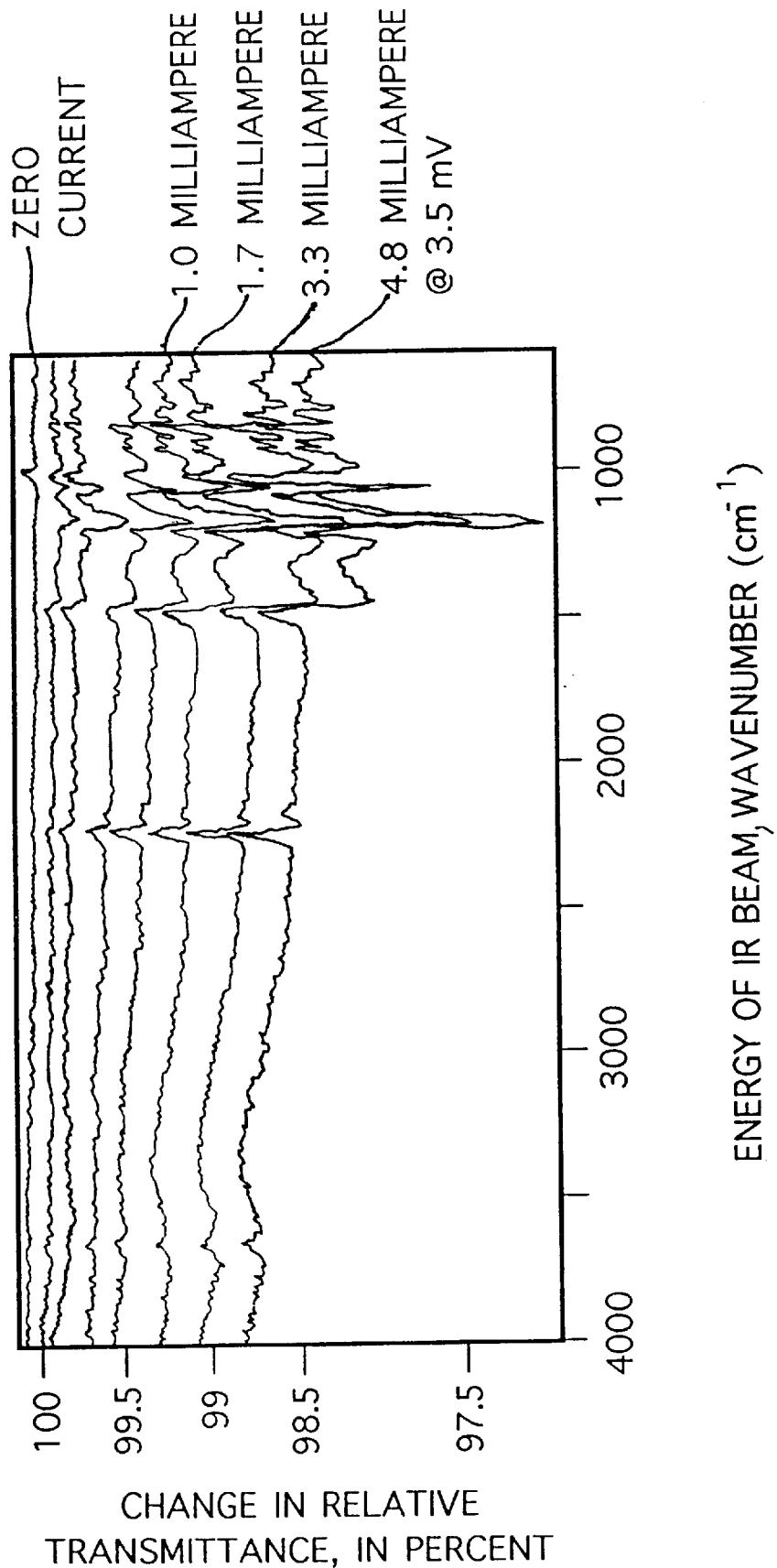
FIG. 3 is a graphical representation of the spectroscopic effect exhibited by devices according to the present invention, showing various spectra and the relationship between the energy of an infrared beam passing through the HSQ-derived thin film, and changes in relative transmittance in percent exhibited by the thin film. In particular.

The spectra depicted in FIG. 3 are the result of first obtaining a background scan without electric tension V applied, so that no current is flowing through the device. At the top is this spectrum relative to itself, appearing as a straight line. Subsequent spectra in FIG. 3 are the result of increasing the applied electric tension V, taking another set of scans, and then ratioing the results against the background scan.

It should be noted, in particular, that as the electric tension V is applied, increases in the ratio (positive features) can be clearly observed in the ν (Si—H) and δ (Si—H) regions, i.e., 2260 $cm^{-1}$ and 898 $cm^{-1}$, respectively. Both positive and negative features are also clearly apparent in the $v^a$ (Si—O—Si) region between about 1200 $cm^{-1}$ and 1000 $cm^{-1}$. Additional features of interest, most likely resulting from top electrode formation, can be pointed out at about 1500–1600 $cm^{-1}$, 3663 $cm^{-1}$ (SiOH), and at about 2200 cm$^{-1}$ (O$_2$SiH$_2$). It is apparent, and the spectra in FIG. 3 indicate, that dramatic changes occur in HSQ-derived dielectric thin films as a function of current flowing through the device.

Figure 4:
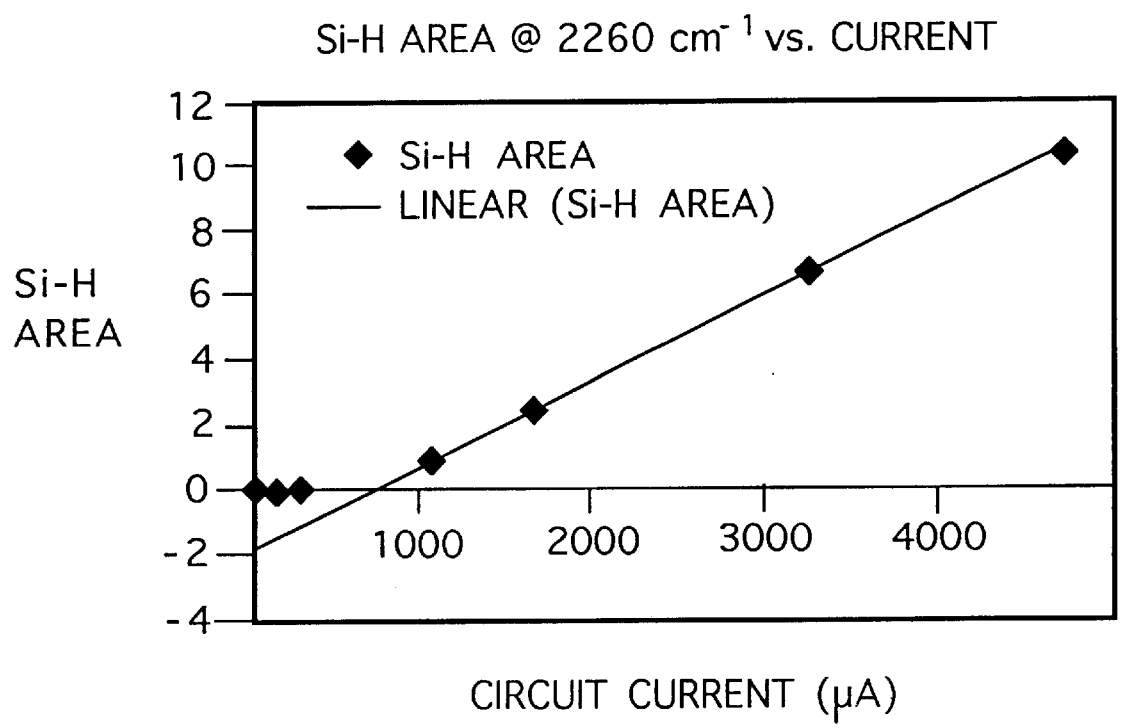

FIG. 4 is a graphical representation showing the relationship between the current flowing through the device of the present invention, and the resultant area under the Si—H vibrational stretch line at about 2,260 cm$^{-1}$ of thin films derived from HSQ resin.

Figure 5:
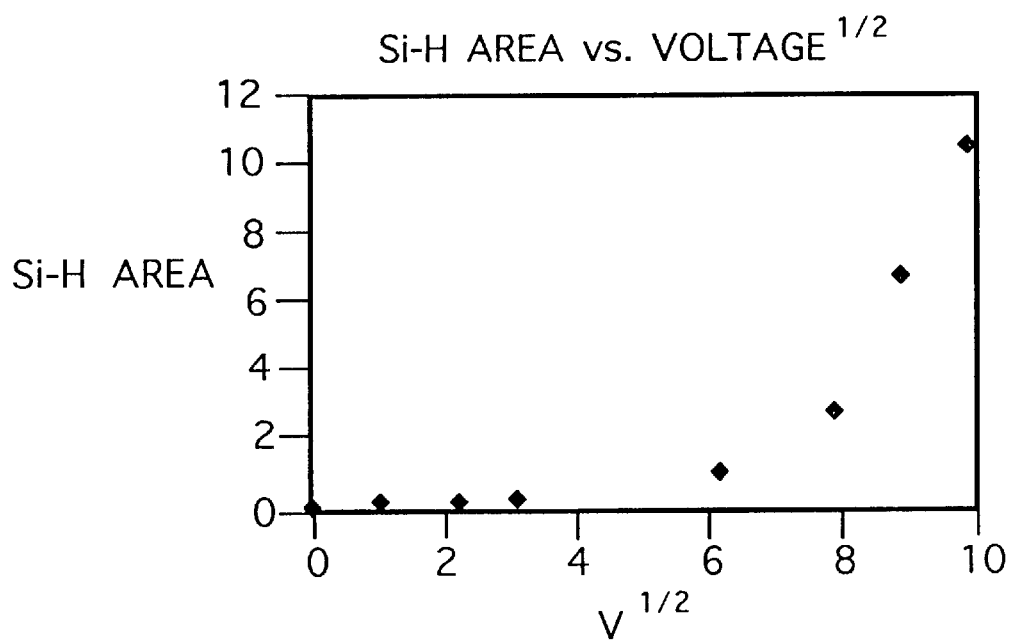

FIG. 5 is similar to FIG. 4, but is a corresponding graphical representation showing the relationship in terms of the square root of the electrical tension V applied to the device, i.e., V$^{1/2}$.

Figure 1:
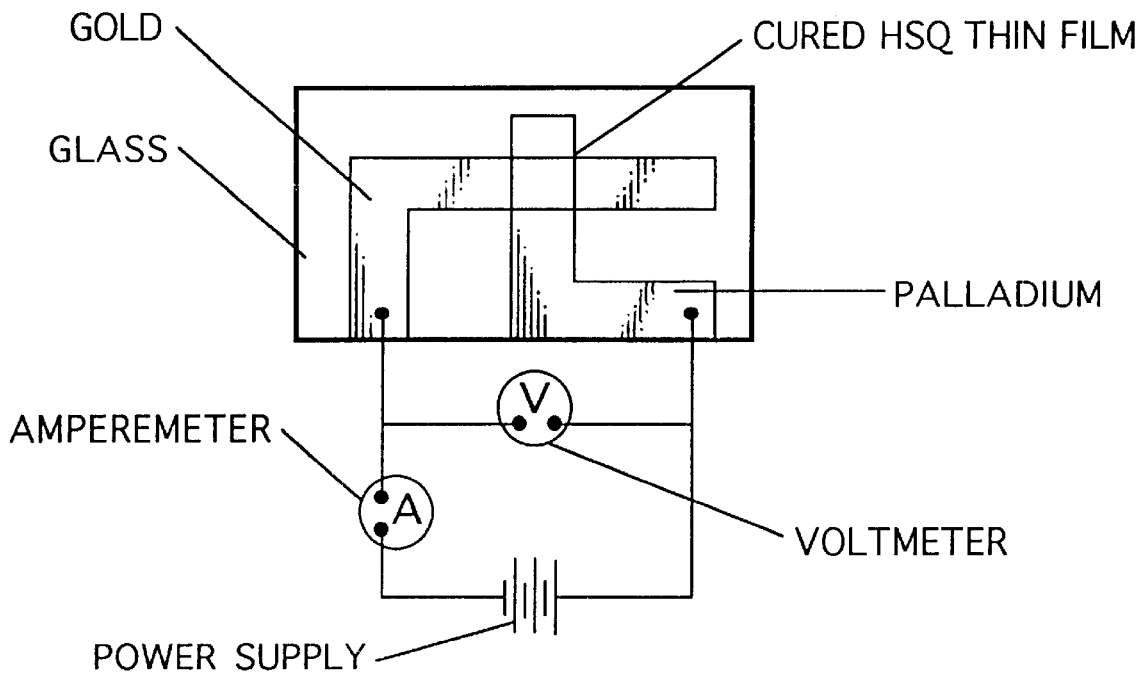
FIG. 1 is a top view and a pictorial representation of a device according to the present invention, including a schematic wiring diagram of the circuit including the power supply for the device.
Figure 6:
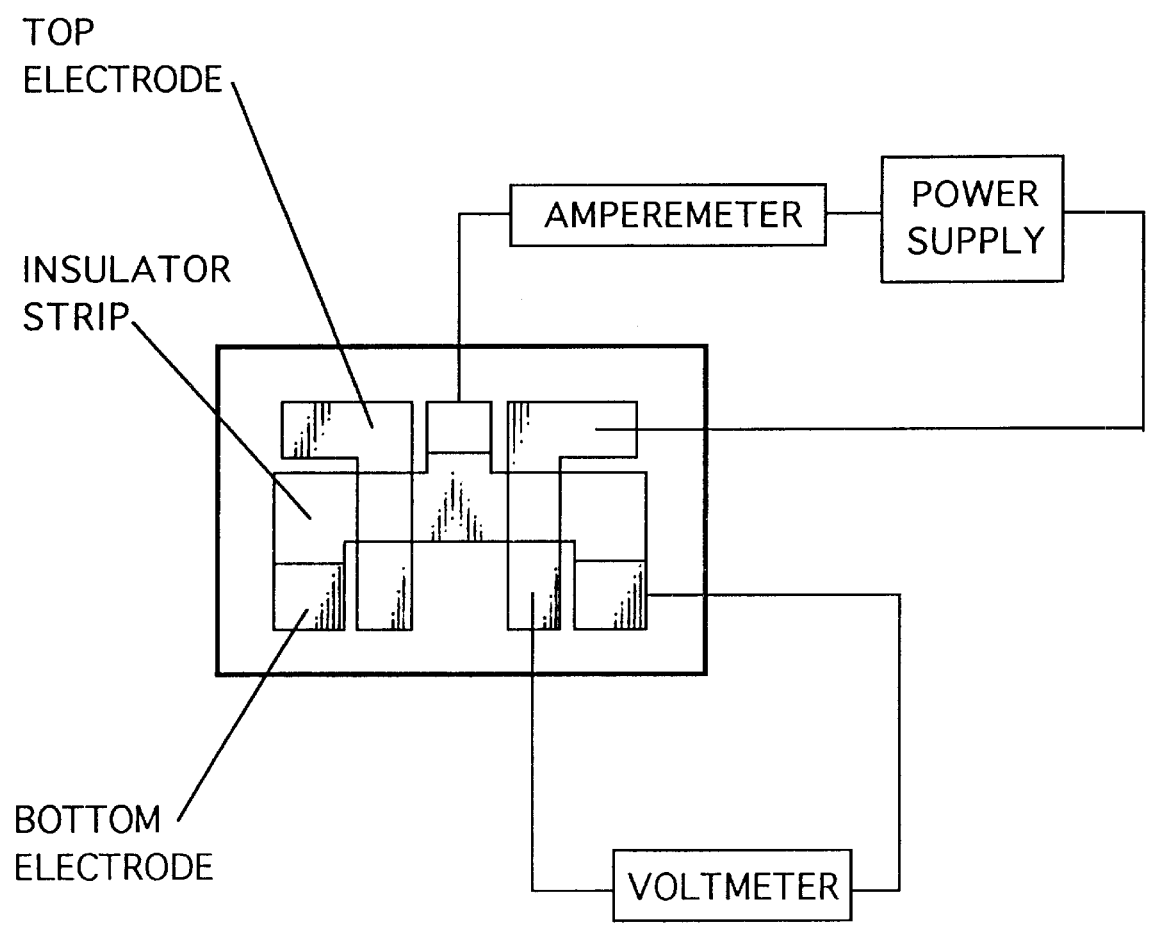

FIG. 6 is an alternate embodiment of a device according to the present invention which is similar to the device depicted in FIG. 1, except that the device shown in FIG. 6 has a construction embodying two devices rather than the single device shown in FIG. 1.

In this alternate embodiment, there are a pair of palladium top electrodes located above the single bottom gold electrode which extends beneath each top electrode. The cured HSQ thin film functions as insulator strip, and covers only selected portions of the bottom electrode as indicated in the drawing. Otherwise, this embodiment of a device operates in similar fashion as the device shown in FIG. 1.

DETAILED DESCRIPTION OF THE INVENTION

Figure 2:
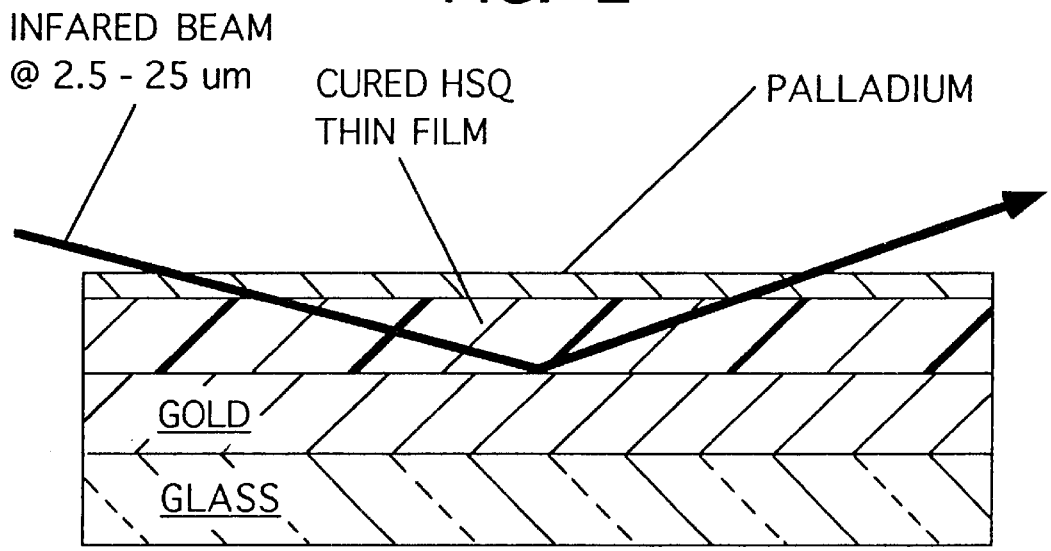
FIG. 2 is a side view and a pictorial representation of a device as shown in FIG. 1, including a reflected beam of infrared radiation.

In FIGS. 1 and 2, the MIM device is seen to include as one of its component parts a dielectric layer consisting of a cured HSQ thin film. The cured HSQ thin film can be produced, for example, by applying a composition comprising hydridosilsesquioxane resin onto a suitable reflective substrate such as a layer of gold.

The hydridosilsesquioxane resin includes hydridosiloxane resins consisting of units of the formula HSi(OH)$_x$(OR)$_y$O$_{z/2}$ in which each R is independently an organic group or a substituted organic group, which when bonded to silicon through the oxygen atom, forms a hydrolyzable substituent. In the formula, x has a value of 0 to 2; y has a value of 0 to 2; z has a value of 1 to 3; and the sum of x+y+z is equal to 3.

Examples of suitable R groups include alkyls such as methyl, ethyl, propyl, and butyl; aryls such as phenyl; and alkenyls such as allyl or vinyl. These resins may be essentially fully condensed (HSiO$_{3/2}$)$_n$ wherein n is 8 or greater or they may be only partially hydrolyzed, i.e., containing some Si—OR, and/or partially condensed, i.e., containing some Si—OH. Although not represented by this structure, the resins may also contain a small number, e.g., less than about 10 percent, of silicon atoms which have either 0 or 2 hydrogen atoms attached thereto, or a small number of SiC bonds due to various factors involved in their formation or handling.

Structurally, such hydridosilsesquioxane resins are essentially ladder or cage polymers of the type:

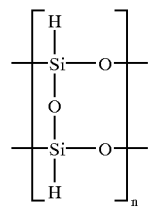

wherein n typically has a value of four or more. For instance, when n has a value of four, the result is a bond arrangement for the silsesquioxane cubic octamer depicted below:

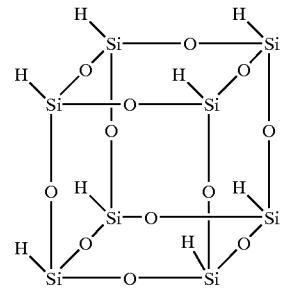

As the value of n is increased, i.e., n being ten or more, double-stranded polysiloxanes of indefinitely higher molecular weight can be formed containing regular and repeated cross-ties in their extended structure.

HSQ resins and methods for their production are known in the art. For example, U.S. Pat. No. 3,615,272, which is incorporated herein by reference, teaches the production of a nearly fully condensed HSQ resin which may contain up to 100–300 parts per million (ppm) silanol, i.e., ≡SiOH, by a process of hydrolyzing trichlorosilane in a benzenesulfonic acid hydrate hydrolysis medium, and then washing the resultant resin with water or aqueous sulfuric acid. Similarly, U.S. Pat. No. 5,010,159, which is hereby incorporated by reference, teaches an alternative method of hydrolyzing hydridosilanes in an arylsulfonic acid hydrate hydrolysis medium to form a resin, which is then contacted with a neutralizing agent.

Other HSQ resins include those described in U.S. Pat. No. 4,999,397; those produced by hydrolyzing an alkoxy or acyloxy silane in an acidic alcoholic hydrolysis medium; those described in Kokai Patents 59-178749, 60-86017 and 63-107122; will also function herein.

Specific molecular weight fractions of the above HSQ resins may also be used. Such fractions and methods for their preparation are taught in U.S. Pat. Nos. 5,063,267 and 5,416,190, which are hereby incorporated by reference. A preferred fraction is a material where at least 75 percent of the polymeric species have a molecular weight above about 1200, and a more preferred fraction is a material where at least 75 percent of the polymeric species have a number average molecular weight between about 1200 and about 100,000.

The hydridosilsesquioxane resin may contain a platinum, rhodium or copper catalyst to increase the rate and extent of cure of the resin. Generally, any platinum, rhodium or copper compound or complex which can be solubilized will be useful. For instance, platinum acetylacetonate, a rhodium catalyst such as RhCl$_3$[Si(CH$_2$CH$_2$CH$_2$CH$_3$)$_2$]$_3$ available from Dow Corning Corporation, Midland, Mich., or cupric naphthenate, are all representative and suitable materials. These catalysts are generally added in an amount of between about 5 to 1000 ppm platinum, rhodium or copper, based on the weight of hydridosilsesquioxane resin. Platinum and rhodium catalysts useful herein are also described in U.S. Pat. No. 4,822,697, herein incorporated by reference.

Ceramic oxide precursors may also be used in combination with the hydridosilsesquioxane resin. The ceramic oxide precursors contemplated include compounds of various metals such as aluminum, titanium, zirconium, tantalum, niobium and/or vanadium, as well as various non-metallic compounds such as those of boron or phosphorus, which may be dissolved in solution, hydrolyzed, and subsequently pyrolyzed at relatively low temperatures to form ceramic oxides.

These ceramic oxide precursors generally have one or more hydrolyzable groups bonded to the metal or non-metal depending on the valence of the metal. The number of hydrolyzable groups in these compounds is not critical as long as the compound is soluble or can be dispersed in the solvent. Likewise, selection of the exact hydrolyzable substituent is not critical, since the substituents are either hydrolyzed or pyrolyzed out of the system. Typical hydrolyzable groups include alkoxy such as methoxy, propoxy, butoxy and hexoxy; acyloxy such as acetoxy; and other organic groups bonded to the metal or non-metal through an oxygen such as acetylacetonate or an amino group. Specific compounds include zirconium tetracetylacetonate, titanium dibutoxy diacetylacetonate, aluminum triacetylacetonate, tetraisobutoxy titanium and $Ti(N(CH_3)_2)_4$. Such ceramic oxide precursors are more fully described in U.S. Pat. Nos. 4,808,653; 5,008,320; and 5,290,354; herein incorporated by reference.

When a ceramic oxide precursor is combined with the hydridosilsesquioxane resin, it is generally used in an amount such that the final coating contains 0.1 to 30 percent by weight of the ceramic oxide precursor.

The hydridosilsesquioxane resin is typically applied to the substrate with solvent. Solvents which may be used include any agent or mixture of agents which will dissolve the hydridosilsesquioxane resin to form a homogeneous liquid mixture without affecting the resulting coating. These solvents include alcohols such as ethyl alcohol or isopropyl alcohol; aromatic hydrocarbons such as benzene or toluene; alkanes such as n-heptane, dodecane or nonane; ketones such as methyl iso-butyl ketone; esters; glycol ethers; and siloxanes including cyclic dimethylpolysiloxanes such as octamethylcyclotetrasiloxane, linear dimethylpolysiloxanes such as hexamethyldisiloxane and octamethyltrisiloxane, and mixtures thereof. The solvent is present in an amount sufficient to dissolve the hydridosilsesquioxane resin to the concentration desired for application as a thin film. Typically, the solvent is present in an amount of 20 to 99 weight percent, preferably from 50 to 80 weight percent, and most preferably about 55 to 75 weight percent.

Some methods for application of the HSQ resin include spin coating, dip coating, spray coating, flow coating, and screen printing. A preferred method for application is spin coating. When a solvent is used, the solvent is allowed to evaporate from the coated substrate, resulting in the deposition of a hydridosilsesquioxane resin thin film. Any suitable means for evaporation may be used such as simple air drying by exposure to an ambient environment, by applying a vacuum, or by the application of mild heat at about 50° C. or less during the early stages of the curing process. When spin coating is used, drying is minimized as the spinning drives off the solvent.

Following application to the substrate, the hydridosilsesquioxane resin thin film is cured to a preferably crack-free insoluble coating by heating the deposited hydridosilsesquioxane thin film for a sufficient time and at a temperature of about 150° C. to 500° C., preferably 200° C. to 400° C., and more preferably 300° C. to 380° C. By insoluble coating is meant a coating that is essentially not soluble in the solvent from which the hydridosilsesquioxane resin was deposited to form the hydridosilsesquioxane thin film, or any solvent mentioned previously as being useful. By crack-free is meant a coating that does not contain any cracks visible to the human eye when examined under an optical microscope at about 1000× or less magnification.

Any method of heating may be used such as a convection oven, rapid thermal processing, a hot plate, or the radiation absorbed from microwave energy, but the preferred heating method is the use of a hot plate. The method used should be capable of rapidly heating the thin film to the desired temperature.

The duration of time that the coating is heated to cure will depend on the environment during the heating, the temperature at which it is heated, i.e., the soak temperature, the rate at which it is heated, and the thickness of the hydridosilsesquioxane resin thin film. For example, at higher soak temperatures and/or higher concentrations of oxygen in the cure environment, the cure time will be shorter. Typically, the coatings are heated from 1 second to 2 hours, preferably from 5 seconds to 30 minutes.

If the coating is not heated long enough, or is heated too long at the soak temperature, then cracking will result. However, there is a window of time at a given soak temperature and environment for a given coating thickness that will produce a crack-free coating. Thus, at lower soak temperatures, the window is large. As the temperature increases, the window decreases. Further, as the amount of oxygen present in the environment increases, the window decreases.

When coatings are not heated long enough, cracks develop when the coatings are cooled to room temperature. It is possible to repair/heal the cracks by further heating the coating for a sufficient period of time. However, when coatings are heated too long, again cracks will develop when the coatings are cooled to room temperature. However, it is not possible to repair those types of cracks.

The environment in which the hydridosilsesquioxane resin thin film is cured is typically an inert environment such as nitrogen, argon, helium, or an environment containing oxygen such as air. As the oxygen content in the environment increases, the minimum time required to cure the hydridosilsesquioxane resin to a crack-free coating will be reduced. Further, the window of time during which a crack-free coating will be produced will be narrowed. When heating at lower temperatures such as about 330° C. or less, it is preferred to have oxygen present to accelerate the cure. However, when heating at higher temperatures such as about 340° C. or more, it is preferred to use an inert environment.

The curing may take place at atmospheric, superatmospheric, or at subatmospheric pressures, but preferably it is carried out at atmospheric pressure. At lower temperatures, higher pressures may be used to accelerate the cure. Vacuum, however, may be used at any temperature.

The rate at which the coatings are heated to the soak temperature plays a role to produce a crack-free coating. If the heating rate is fast, then the window of time in which a crack-free coating can be produced will be longer, or higher soak temperatures and/or higher coating thickness may be achieved without cracking. On the contrary, if the heating rate is slow, then the window of time in which a crack-free coatings can be produced will be shorter, or lower soak temperatures and/or reduced coating thickness will be necessary to achieve the crack-free coating.

If desired, thick coatings may be produced by forming a single thick hydridosilsesquioxane film, and thereafter curing it under controlled conditions. Thick coatings may also be produced by forming a hydridosilsesquioxane thin film, curing it under controlled conditions, and repeating the process until a desired thickness in the coating or film is achieved.

The HSQ-derived thin films preferred in accordance with the teaching of this invention generally have a thickness of at least about 0.1 μm (100 nanometer), and are preferably of a thickness in the range of 0.1 μm (100 nanometer) to about 1.5 μm (1,500 nanometer).

In particular, therefore, and according to the concept of the present invention, a thin film of silicon dioxide derived from hydridosilsesquioxane resin is deposited onto a reflective electrode and cured by a heat treatment, and then a metal-insulator-metal sandwich is formed by depositing a transparent or a semitransparent top electrode onto the HSQ thin film. By transparent or semitransparent is meant that the film used as the top electrode is deposited onto the HSQ thin film in a layer that is so thin, that the beam of infrared radiation is capable of shining through the top electrode. A reflective back electrode is supported on a glass or other type of substrate and completes the MIM sandwich device.

Alternatively, the HSQ film can be deposited first onto a semitransparent electrode on a suitable transparent substrate such as a transparent conductive oxide or a thin metal film, and the reflective electrode is deposited last onto the cured HSQ film.

The spectrally resolved reflectivity of the device is measured by shining a beam of infrared radiation through the transparent top electrode, and reflecting it from the back electrode, thus passing the beam twice through the HSQ thin film. Upon application of an electric potential difference across the two electrodes, the spectral characteristics of the HSQ thin film change while an electric current is flowing through the device, according to the residual resistance of the HSQ thin film. The changes occur in the spectral bands characteristic of the Si—H stretch and bend vibrations, the Si—O—Si manifold, and the Si—O—H line. These changes are reversible, and their extent can be controlled by the device current.

This response of HSQ thin films in device configurations is not believed to have been observed previously in the spectral signature, i.e., fingerprint, of such materials. The fact that the infrared signature of HSQ-derived thin films can be altered over large areas of a device geometry by the simple application of an electric potential is therefore unique.

With reference to the drawings, in FIGS. 1 and 2 there can be seen an experimental arrangement for a device which consists of a suitable substrate such as a glass slide upon which is supported an evaporated gold back electrode typically having a thickness of about 0.15 μm (150 nanometer). Deposited on the gold back electrode is the HSQ-derived thin film which has a thickness in the range of about 0.1 μm (100 nanometer) to about 1.5 μm (1,500 nanometer). A transparent or semitransparent palladium top electrode is deposited over the HSQ-derived thin film. The top electrode is applied over the HSQ-derived thin film as an evaporated layer having a thickness of about 0.005 μm to 0.08 μm (5 to 80 nanometer).

The top electrode can be constructed of other suitable electrically conductive or semiconductive materials such as gold, platinum, silver, chromium, aluminum, copper, nickel, titanium, and tin; and alloys such as titanium-tungsten, titanium nitride, nickel-chromium, indium tin oxide, and gallium arsenide. Particularly preferred herein is palladium. The back electrode can also be constructed of other suitable electrically conductive or semiconductive materials such as palladium, platinum, silver, chromium, aluminum, copper, nickel, titanium, and tin; and alloys such as titanium-tungsten, titanium nitride, nickel-chromium, indium tin oxide, and gallium arsenide. Particularly preferred herein is gold.

Contact between the top electrode, the back electrode, and the HSQ-derived thin film, can be established by any known technique. For instance, the top electrode and the back electrode can be formed on the HSQ-derived thin film by evaporating or sputtering an appropriate electrode material onto the HSQ-derived thin film in a vacuum.

In sputtering, the part to be coated is placed in an evacuated chamber in close proximity to a flat plate of a coating material, i.e., a metal. The flat plate functions as a target, and it is bombarded by a beam of electrons. The electrons essentially dislodge atoms from the target and sputter them onto the surface of the part facing the target. Only the portion of the part directly exposed to the target is coated. The advantage of sputtering techniques is that the purity of the coating can be controlled, and parts are not required to be heated during the coating process.

Techniques involving heat can also be employed such as processes employing electron beam heating. Other alternate deposition techniques that can be used include physical vapor deposition, electroless plating, and electrolytic plating of metals. In addition, the electrodes can be formed as a metal pattern which is deposited by a photolithographic technique.

When gold is selected as the material for an electrode, it can be deposited by methods generally described in U.S. Pat. No. 5,616,202 (Apr. 1, 1997), entitled "Enhanced Adhesion of H-Resin Derived Silica to Gold". According to this patented method, silica derived from HSQ resin is adhered to gold by a low temperature annealing process carried out in an oxidizing atmosphere for about an hour or more.

Alternatively, HSQ-derived thin films can be deposited directly onto preformed top electrodes and preformed back electrodes to create the necessary electrical contacts, or preformed top electrodes and preformed back electrodes can be adhered directly to HSQ-derived thin films by known techniques.

Electric circuitry for supplying power to the MIM device is shown in FIG. 1, and consists of a power supply, an amperemeter, and a voltmeter. A beam of infrared radiation is shown in FIG. 2, and the beam can be incident under an angle to optimize observability of the spectrum. The beam of infrared radiation can be generated by any conventional source such as a laser. The beam of infrared radiation should have a wavelength in the range of about 2.5 μm to about 25 μm (4,000 to 400 $cm^{-1}$), although other wavelengths within the infrared region of the electromagnetic spectrum can be employed, i.e., wavelengths in the range of from about 0.75 μm to about 1,000 μm (13,333 to 10 $cm^{-1}$). The spectrum is recorded in the absorption mode with the infrared beam traversing the HSQ thin film two times.

FIG. 3 shows a series of absorption spectra which were obtained from top to bottom at increasing electric bias across the device illustrated in FIGS. 1 and 2. Each spectrum was plotted as a ratio to an original trace that was obtained without bias. For that reason, an absorption feature that decreases as a function of treatment appears as a line with increased value, while smaller values of the ratio indicate an increase in absorption, i.e., a decrease in transmission.

The abscissa in FIG. 3 represents the energy of the infrared beam. The location of an infrared absorption band or peak can be specified in frequency units by a wavenumber measured in reciprocal centimeters ($cm^{-1}$) or by its wavelength measured in micrometers ($\mu m$). The wavenumber is used in FIG. 3. For example, a wavenumber having a value of 4000 $cm^{-1}$ represents a high energy beam and corresponds to a beam having a wavelength of 2.5 $\mu m$, and a wavenumber having a value of 1000 $cm^{-1}$ represents a low energy beam and corresponds to a beam having a wavelength of 10.0 $\mu m$. The current passing through the device of FIGS. 1 and 2 at the time the absorption spectra were obtained is shown as the ordinate on the right side of FIG. 3.

Changes in the spectral distribution of the infrared reflectivity of the HSQ-derived thin film were obtained with the HSQ thin film under vacuum to exclude reactive gases such as oxygen. It can be seen in FIG. 3, that the stretch vibration at 2260 $cm^{-1}$ and the bend vibration at 890 $cm^{-1}$, diminished in the film as the applied electric tension V was increased from the top trace to the lowest trace. Simultaneously, the Si—O—Si bands at about 1200 $cm^{-1}$ increased with this treatment. Thus, FIG. 3 demonstrates the loss of the Si—H band with increasing current and the growing absorption in the Si—O—Si region. Also, at about 1530 $cm^{-1}$, a new band appeared in a spectral region characteristic for the Si—OH vibration. Additional changes were observed in a broad region around 3500 $cm^{-1}$ due to the O—H stretch.

As an illustration, FIG. 4 shows the area under the Si—H stretch at 2260 $cm^{-1}$, i.e., the decrease in Si—H content in the film, plotted as a function of the device current. In FIG. 4, one can observe that the SiH formation was linear with current after a threshold of 0.7 mA. This point corresponds to an applied potential, and this can be seen in FIG. 5 at about 5.5 on the abscissa, where the SiH increase is plotted as a function of the square root of the electric tension V.

These features are reversible such that when the electric bias is removed, the spectral characteristics revert to those observed before treatment.

Thus, FIGS. 3–5 indicate that Si—H and the Si—O—Si vibrational lines can be controlled in devices according to the present invention, that is, lines at 2260 $cm^{-1}$ and below about 1000 $cm^{-1}$, and bands falling between about 1050 and 1300 $cm^{-1}$, respectively. While the magnitude of the effect was observed using an HSQ-derived thin film of only 0.15 $\mu m$ (150 nanometer) in thickness, it can be as high as four percent using an electric potential difference across the top and back electrodes not exceeding about 4 millivolt.

In the use of devices according to the present invention, a power supply with a variable output is applied to the MIM device, with one connection being provided to the non-transparent back electrode, i.e., the gold layer, and the other connection being provided to the semitransparent top electrode, i.e., the palladium layer. Then the intensity of a reflected beam of an incident source of infrared radiation is modulated as a function of the current flowing through the MIM device. When the reflected beam is analyzed, its spectral characteristics will be found to vary accordingly, in that Si—H absorption lines decrease while SiO absorption lines increase, and vice versa, as the power supply settings are changed.

The device is suitable for use as an optical switch in the processing or transmission of data in communications or computational devices, i.e., microprocessors. When the device is used as an optical switch, it should be noted that instead of measuring the full spectral characteristics of the device, a monochromatic beam of infrared radiation, i.e., a beam of light of only one wavelength, is selected such as to coincide with one of the vibrational absorptions of the HSQ-derived insulator material, and is switched ON or OFF as it interacts with the thin film according to the electric tension V applied to the device.

In another application, the device could be installed or constitute a portion of a coating applied to a moving object such as an aircraft or watercraft. In such an application, the device would be configured as a metal-insulator-metal device in order that the infrared reflection spectrum, i.e., the infrared signature, could be randomly modulated for the purpose of scrambling, jamming, or damaging detection signals emitted by remote observers.

In a further application, the device could be installed or constitute a portion of a coating on a window pane. This would enable one to control the amount of infrared radiation that passes through the window pane.

While the present invention has been described in terms of hydridosilsesquioxane resins, i.e., $(HSiO_{3/2})_n$, in particular, it should be understood that it is intended to encompass other types of silsesquioxane resins, such as alkyl silsesquioxane resins, e.g., $(CH_3SiO_{3/2})_n$, aryl silsesquioxane resins, e.g., $(C_6H_5SiO_{3/2})_n$, as well as mixtures of such resins. In addition, when resins of the type $(HSiO_{3/2})_n$ are employed, the hydrogen atom may be substituted in varying degrees by alkyl or aryl groups.

Other variations may be made in compounds, compositions, and methods described herein without departing from the essential features of the invention. The embodiments of the invention specifically illustrated herein are exemplary only and not intended as limitations on their scope except as defined in the appended claims.

What is claimed is:

1. A method for varying the infrared spectrum of a reflected beam of light, said method comprising
    a) supplying a reflecting device comprising
        a)i) a first conductive electrode which at least partially reflects infrared light,
        a)ii) an insulative layer comprising a silicon dioxide thin film derived from a hydrogen silsesquioxane resin, an alkyl silsesquioxane resin, or an aryl silsesquioxane resin; and
        a)iii) a second conductive electrode at least partially transparent to infrared light, wherein said insulative layer a)ii) is positioned between said first conductive electrode a)i and said second conductive electrode a)iii);
    b) irradiating said reflecting device with infrared light impinging on said second conductive electrode a)iii) and being reflected by said first conductive electrode a)i) as reflected infrared light;
    c) altering the intensity of reflected infrared light exiting the metal-insulator-metal device through said second conductive electrode a)iii) by establishing an electrical potential between said first conductive electrode a)i) and said second conductive electrode a)iii); and
    d) optionally monitoring the relative intensity of said infrared light reflected at minimally two different electrical potentials across conductive electrodes a)i) and a)iii).

2. The method of claim 1 wherein the infrared light has a wave number which falls within the wave n umber range of an Si—H, an Si—O—Si, or both an Si—H and Si—O—S vibrational energy level.

3. The process of claim 1 wherein said conductive electrode a)iii comprises a metal.

4. The process of claim 1 wherein said conductive electrode a)iii) comprises a material selected from the group consisting of palladium, platinum, silver, chromium, aluminum, copper, nickel, titanium, tin titanium-tungsten alloys, titanium nitride, nickel-chromium alloys, indium tin oxide, gallium arsenide, and mixtures thereof.

5. The process of claim 1 wherein said conductive electrode a)i) comprises a material selected from the group consisting of gold, platinum, silver, chromium, aluminum, copper, nickel, titanium, tin titanium-tungsten alloy, titanium nitride, nickel-chromium alloy, indium tin oxide, and gallium arsenide.

6. A method according to claim 1 in which the conductive electrode a)iii) has a thickness in the range of about 0.005 μm (5 nanometer); and the conductive electrode a)i) has a thickness of at least about 0.15 μm (150 nanometer).

7. A method according to claim 1 in which the beam of infrared radiation has a wavelength in the range of about 2.5 μm to 25 μm.

8. A method according to claim 1 in which the beam of infrared radiation is essentially monochromatic.

9. The method of claim 1, wherein said reflective device is located on or comprises a surface of an object subject to remote observation, said method further comprising modifying a spectral signature of said object by establishing an electrical potential between conductive electrodes a)i) and a)iii) and altering current flow through said device thereby.

10. The method of claim 9, wherein said object is an aircraft or watercraft.

11. The method of claim 1, wherein said reflecting device is employed in a communications or computational device where data-transmitting infrared light is used to transmit data, and said reflective device varies the intensity of said data-transmitting infrared light.

12. The method of claim 11 wherein said reflective device operates as an optical switch.

13. The method of claim 12 in which the data-transmitting infrared light is a monochromatic beam having a wavelength which coincides with a vibrational absorption of the insulative layer a)ii).

14. A method for altering the intensity of transmitted infrared light by an electrooptical device, said device comprising three active layers, said three active layers optionally mounted on immediately adjacent non-active layers, said method comprising
   a) supplying a reflecting device Comprising, as active layers
      a)i) a first conductive electrode at least partially transparent to infrared light,
      a)ii) an insulative layer comprising a silicon dioxide thin film derived from a hydrogen silsesquioxane resin, an alkyl silsesquioxane resin, or an aryl silsesquioxane resin; and
      a)iii) a second conductive electrode at least partially transparent to infrared light, wherein said insulative layer a)ii) is positioned between said first conductive electrode a)i) and said second conductive electrode a)iii);
   b) irradiating said reflecting device with infrared light impinging on said second conductive electrode a)iii) said infrared light being transmitted through said first conductive electrode a)i) as transmitted infrared light;
   c) altering the intensity of transmitted infrared light exiting the electrooptical device through said conductive electrode a)i) by establishing an electrical potential between said first conductive electrode a)i) and said second conductive electrode a)iii); and
   d) optionally monitoring the relative intensity of infrared light transmitted at minimally two different electrical potentials across conductive electrodes a)i) and a)iii).

15. The method of claim 1, wherein the infrared light reflected from the reflective device is monitored.

16. The method of claim 1, wherein the infrared light reflected is monitored and an infrared reflectivity of the device is maintained or adjusted in view of the monitored intensity of the reflected infrared light by altering the electrical potential between conductive electrodes a)i) and a)iii).

17. The method of claim 14 wherein the infrared transmission of said device is varied by varying the electric potential applied between said first and second conductive electrodes.

18. The method of claim 17 wherein the intensity of the transmittal infrared light is monitored and the electric potential is varied to alter the infrared transmission as a result.

19. An infrared modulating device comprising an electrooptical device consisting of three active layers, said active layers comprising
   a)i) a first conductive electrode which at least partially transmits infrared light, and when constructed of metal has a thickness in the range of 5 nm to 80 nm,
   a)ii) an insulative layer comprising a silicon dioxide thin film derived from a hydrogen silsesquioxane resin, an alkyl silsesquioxane resin, or an aryl silsesquioxane resin; and
   a)iii) a second conductive electrode transparent or reflective of infrared light, wherein said insulative layer a)ii) is positioned between said first conductive electrode a)i and said second conductive electrode a)iii); and
   wherein said electrooptical device is sandwiched between two electrooptically inactive but at least partially infrared transparent layers.

20. The device of claim 19 wherein at least one of said electrooptically inactive layers comprises glass.

\* \* \* \* \*

UNITED STATES PATENT AND TRADEMARK OFFICE
CERTIFICATE OF CORRECTION

PATENT NO.    : 6,572,974 B1
DATED         : June 3, 2003
INVENTOR(S)   : Mark Angelo Biscotto et al.

It is certified that error appears in the above-identified patent and that said Letters Patent is hereby corrected as shown below:

<u>Title page,</u>
Item [75], Inventors, delete "Mark Angelo Biscotte, Ann Arbor"; and insert therefor -- Mark Angelo Biscotto, Ann Arbor --

Signed and Sealed this

Twenty-third Day of September, 2003

JAMES E. ROGAN
*Director of the United States Patent and Trademark Office*